(12) United States Patent
Hoefler et al.

(10) Patent No.: US 12,181,522 B2
(45) Date of Patent: Dec. 31, 2024

(54) INTEGRATED CIRCUIT HAVING TEST CIRCUITRY FOR MEMORY SUB-SYSTEMS

(71) Applicant: NXP USA, Inc., Austin, TX (US)

(72) Inventors: Alexander Hoefler, Austin, TX (US); Jeffrey Stump, Lexington, TX (US)

(73) Assignee: NXP USA, Inc., Austin, TX (US)

( * ) Notice: Subject to any disclaimer, the term of this patent is extended or adjusted under 35 U.S.C. 154(b) by 50 days.

(21) Appl. No.: 18/049,775

(22) Filed: Oct. 26, 2022

(65) Prior Publication Data

US 2024/0142520 A1    May 2, 2024

(51) Int. Cl.
| | |
|---|---|
| G01R 31/3185 | (2006.01) |
| G01R 31/317 | (2006.01) |
| G11C 7/10 | (2006.01) |
| G11C 29/04 | (2006.01) |
| G11C 29/32 | (2006.01) |

(52) U.S. Cl.
CPC ........ *G01R 31/318541* (2013.01); *G01R 31/31722* (2013.01); *G01R 31/318558* (2013.01); *G11C 7/106* (2013.01); *G11C 7/1087* (2013.01); *G11C 2029/0401* (2013.01); *G11C 29/32* (2013.01); *G11C 2029/3202* (2013.01)

(58) Field of Classification Search
CPC .... G11C 2029/3202; G11C 2029/0401; G11C 29/32; G11C 7/1087; G11C 7/106; G01R 31/318541; G01R 31/318536; G01R 31/318558; G01R 31/31722
See application file for complete search history.

(56) References Cited

U.S. PATENT DOCUMENTS

| | | | |
|---|---|---|---|
| 6,668,347 B1 | 12/2003 | Babella et al. | |
| 7,188,330 B2 | 3/2007 | Goyal | |
| 2008/0177941 A1* | 7/2008 | Yim | G06F 8/4441 |
| | | | 711/170 |
| 2009/0116321 A1* | 5/2009 | Shirur | G11C 29/20 |
| | | | 365/201 |
| 2013/0080847 A1* | 3/2013 | Zorian | G11C 29/16 |
| | | | 714/E11.169 |
| 2013/0185608 A1* | 7/2013 | Bhawmik | G01R 31/318558 |
| | | | 714/E11.155 |
| 2021/0335439 A1 | 10/2021 | Mondello et al. | |

\* cited by examiner

*Primary Examiner* — April Y Blair
*Assistant Examiner* — Sazzad Hossain
(74) *Attorney, Agent, or Firm* — Joanna G. Geld

(57) ABSTRACT

A system includes test control circuitry and a memory. The memory includes a memory array, a pre-decode circuit, and a plurality of address latches. Each address latch of the plurality of address latches is configured to operate in a scan chain of a plurality of scan chains for scan testing. A first set of the plurality of address latches each has a data input coupled to a corresponding address pin of the first memory and each has an output coupled to the pre-decode circuit. A second set of the plurality of address latches, mutually exclusive of the first set, each has a data input coupled to a data input of at least one latch in the first set of the plurality of latches and each is configured to not provide any input to the pre-decode circuit.

20 Claims, 4 Drawing Sheets

INTEGRATED CIRCUIT HAVING TEST CIRCUITRY FOR MEMORY SUB-SYSTEMS

BACKGROUND

Field

This disclosure relates generally to integrated circuits, and more specifically, test circuitry for memory sub-systems in an integrated circuit.

Related Art

Compiled memories include control logic blocks that are re-used across different instance configurations, in which, for example, different instances of a memory on an integrated circuit may have different memory sizes. Compiled memories may also include one or more compiler options which are selectable memory features that are selected at compile time for integration onto the integrated circuit. In general, smaller compiled memory instances include fewer external control pins, due to, for example, a reduced size address bus which results in unused address control pins. In custom memory blocks, the unused logic, such as unused address latches corresponding to the unused pins, can simply be removed with a circuit and layout design update. However, in the case of compiled memories, redesigning the circuit and layout results in a substantial increase in layout and design efforts since every possible memory configuration would require a separately designed control block. Further, all other design views would similarly have to be updated in more complex ways, negating the design effort advantages afforded by compiled memories. However, in the case of unused logic and pins for compiled memories, a need exists for an improved design structure which results in increased fault coverage for the unused logic and pins.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
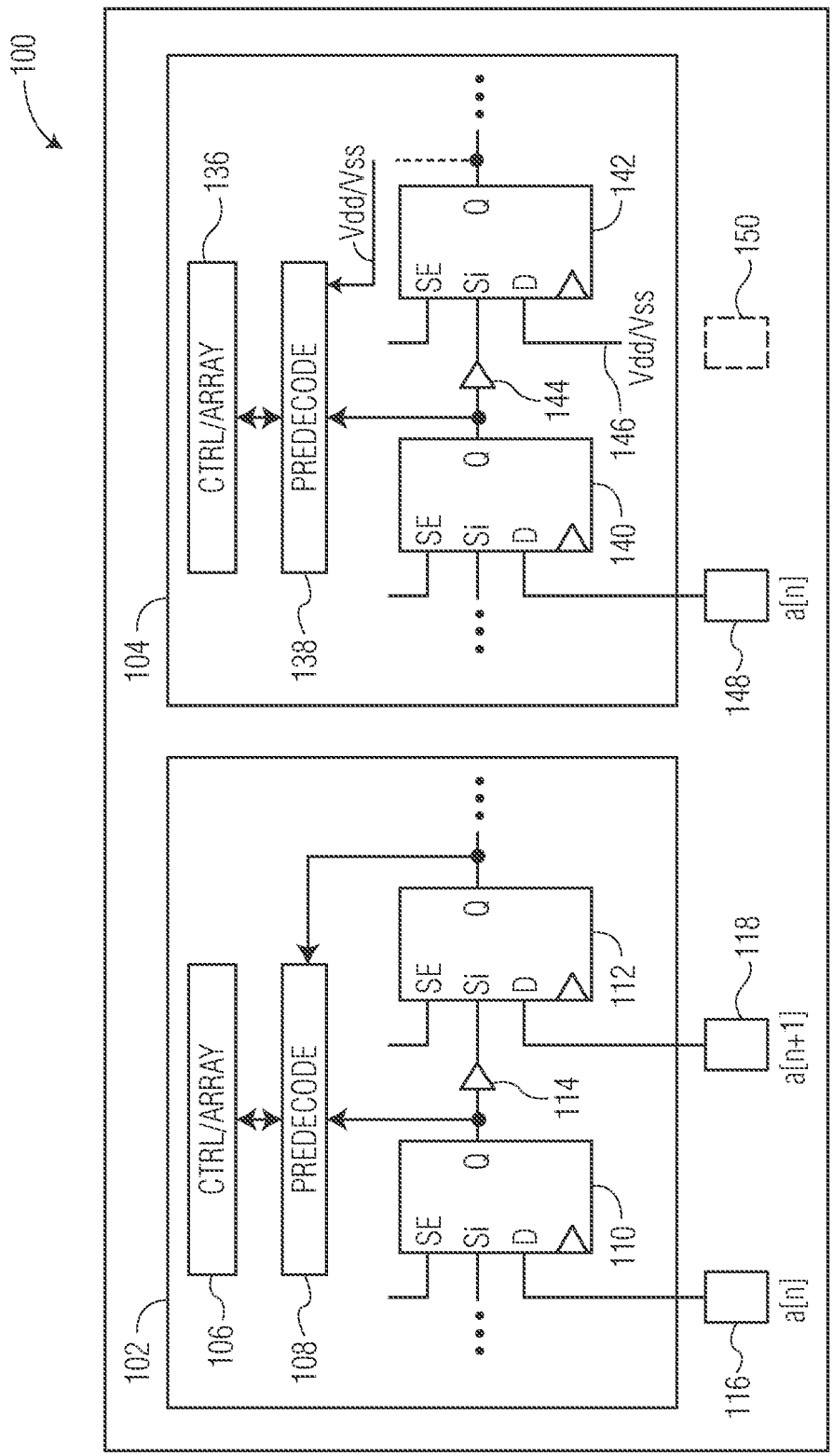
FIG. 1 illustrates a conventional memory system.

In one aspect, unused latches of a compiled memory, which exist due to a subset of the pins being unneeded and thus removed when generating the compiled memory, share an existing pin of the compiled memory with another latch. In this manner, while the outputs of the unused latches are not provided to or used by a pre-decoder to generate the appropriate address bits for a memory access to an addressed location within the array of the compiled memory, the data inputs of the unused latches are connected to an existing pin. These existing pins are generally accessible during scan testing. Because of these connections to existing pins, unused latches may allow for improved fault coverage during scan testing since they can also change state and capture different values during a capture phase of the scan test, as compared to being permanently capturing a fixed value.

A memory compiler for producing compiled memories may include selectable features, such as, for example, memory size, number of I/Os, or the like. Therefore, a set of features can be selected for each instance of a compiled memory generated by a memory compiler. For example, in the case of memory size being a selectable feature of the memory compiler, the memory compiler produces a first instance of a compiled memory when a first memory size is selected and produces a second instance of a compiled memory when a second, e.g. smaller, memory size is selected. In this example, the first instance of the compiled memory is larger than the second instance. Note that each instance of a compiled memory produced by a particular memory compiler may include many shared aspects and features, only differing with respect to the selectable features allowed by the particular memory compiler. A compiled memory typically corresponds to an Electronic Design Automation (EDA) generated memory design and may provide many "design views (i.e. abstractions)" of the memory design, such as the netlist of the compiled memory, a layout of the compiled memory meeting required layout and processing constraints, etc. The memory manufactured in accordance with the EDA-generated memory design can be referred to as the compiled memory.

Therefore, while a compiled memory is limited by the selectable features offered by a particular memory compiler, as opposed to a custom memory which can be designed with a far greater variety of features, it is typically cheaper, less complex, and faster, with respect to design time for, e.g., an overall system on a chip (SoC) which may use different instances of a compiled memory, as compared to the cost, complexity, and design time of a custom memory. It is also fairly straight forward to change a selectable feature of a memory compiler to generate a new compiled memory, while changing any feature of a custom memory requires far more redesigning. Further, testing of compiled memories is important to ensure proper operation of memory systems with an SoC. This testing may be performed, as known in the art, with built-in self-test (GIST) techniques, such as scan testing (i.e. scan chain testing). In the case of multiple instances of compiled memories, the compiled memories may all shares the same scan chain configuration, such that scan testing can be performed across multiple compiled memories of an SoC.

FIG. 1 illustrates a conventional memory system including a first memory 102 and a second memory 104. Memory 102 includes ctrl/array 106 which may include a memory array, row decoders, column decoders, and corresponding memory control circuitry. Memory 102 is a first instance of a compiled memory having a first size and configured to receive a first number, N, of address bits at its address pins. Memory 102 includes a pre-decode circuit 108 and address latches 110 and 112. Address latches 110 and 112 are coupled to corresponding address pins 116 and 118, respectively, and pre-decode circuit 108 is coupled between outputs of the address latches and ctrl/array 106. Latch 110 has a D input coupled to address pin 116 to receive one bit of an N-bit address value, a[n], and latch 112 has a D input coupled to address pin 118 to receive another bit of the N-bit address value, a[n+1]. A Q output of latch 110 is coupled to pre-decode circuit 108 and to a buffer 114, and a Q output of latch 112 is coupled to pre-decode circuit 108. Note that the D input of a latch may be referred as a data input, and the Q output of a latch as the data output. Latch 110 also includes an Si input, which can be referred to as the scan input, a shift enable (SE) control input, and a clock input (indicated by the triangle). Similarly, latch 112 also includes an Si input, a SE control input, and a clock input. And output of buffer 114 is coupled to the Si input of latch 112.

Memory 102 is coupled to N address pins which are coupled to receive the N-bit address value, a[N−1:0], in which each address pin is coupled to a D input of a corresponding address latch. Therefore, memory 102 also includes N address latches, in which a[n] corresponds to one bit of a[N−1:0] and a[n+1] to another bit of a[N−1:0]. Note that not all address bit pins or corresponding address latches are illustrated in FIG. 1. The Q output of each address latch is coupled to pre-decode circuit 108, which provides the resulting pre-decode address lines to ctrl/array 106. The pre-decode address lines can be used by ctrl/array 106 to address a selected address location with the array of memory 102, as known in the art. For example, a first portion of the pre-decode address lines may be provided to activate a selected block of the array, a second portion may be provided to a row decoder to activate a selected word line of the selected block, and a third portion may be provided to a column decoder to activate selected bit lines of the selected block.

The address latches, such as latches 110 and 112, can be configured as scan chains to enable scan testing. Therefore, in operation, each address latch can operate in functional mode and a scan test mode (i.e. scan mode). Such operation is known, and therefore will only briefly be described. Each latch, when in functional mode, operates normally to capture the input address value and provide the input address value to pre-decode circuit 108. In this case, SE is negated to a logic level zero such that each latch provides the corresponding address value at its D input as its Q output upon receiving an active edge of a functional clock at its clock input. When in scan mode, a shift phase first shifts a test pattern into each scan chain (during which a previous test result can be shifted out). During the shift phase, the SE inputs of the latches are asserted to a logic level one such that the value received from the Q output of a previous latch of the scan chain is received at the Si input and latched on an active edge of a shift clock provided to the clock inputs of the latches. For example, the Q output of latch 110 received via buffer 114 at the Si input of latch 112 is shifted into latch 112 in response to an active edge of the shift clock. After the shifting of the test patterns into the scan chains is completed, during a subsequent capture phase of the scan mode, a predetermined number of clock cycles of the functional clock is provided. Upon entering the shift phase again, as new test patterns are shifted into the scan chains, the current values (captured in the scan chains as a result of the predetermined number of clock cycles applied during the capture phase) are shifted out.

Memory 104 is a second instance of a compiled memory having a smaller size and therefore configured to receive fewer (less than N) address bits at its address pins. Therefore, memory 104 includes fewer address pins as compared to memory 102. Memory 104 includes ctrl/array 136, pre-decode circuit 138, address latches 140 and 142, and a buffer 144. Note that the operation and connectivity of these elements is analogous to the similarly named elements of memory 102. However, since memory 104 is smaller, pre-decode circuit 138 provides fewer pre-decoded address lines to ctrl/array 136 which operates on fewer address lines to address a selected memory location within the array of memory 104. Memory 104, analogous to memory 102, also includes N address latches, in which some of the N latches are unneeded and are therefore unused and disconnected from any address pins and disconnected from pre-decode circuit 138. For example, latch 142 is unused and therefore, its Q output is not connected to pre-decode circuit 138, and its D input is not connected to any address pin, in which location 150 corresponds to a removed address pin which was not needed in the design due to being a smaller instance of the compiled memory. In this case, the input to pre-decode circuit 138 which corresponds to the Q output of unused latch 142 is permanently tied to a predetermined power supply node (e.g. which may correspond to the supply node which receives the power supply Vdd or the power supply Vss, and is thus indicated as "Vdd/Vss" in FIG. 1), and similarly, the D input to unused latch 142 is permanently tied to a predetermined power supply node (e.g. Vdd/Vss).

With the D input of unused latch 142 permanently tied to a predetermined power supply node, during scan testing, the D input cannot be exercised (cannot be made to change states) to determine correct operation of latch 142. With unused latch 142 therefore being untestable logic, an automatic test pattern generation (ATPG) flow will have reduced fault coverage since a scan operation cannot reach the D input of latch 142, and a scan capture operation will always capture the same logic state. For example, if D cannot be changed due to being permanently tied to a power supply node, unused latch 142 can never store a different state, and some faults, such as a stuck at fault at the D input or Q output of latch 142, or some of the internal nodes of latch 142, cannot be detected.

Figure 2:
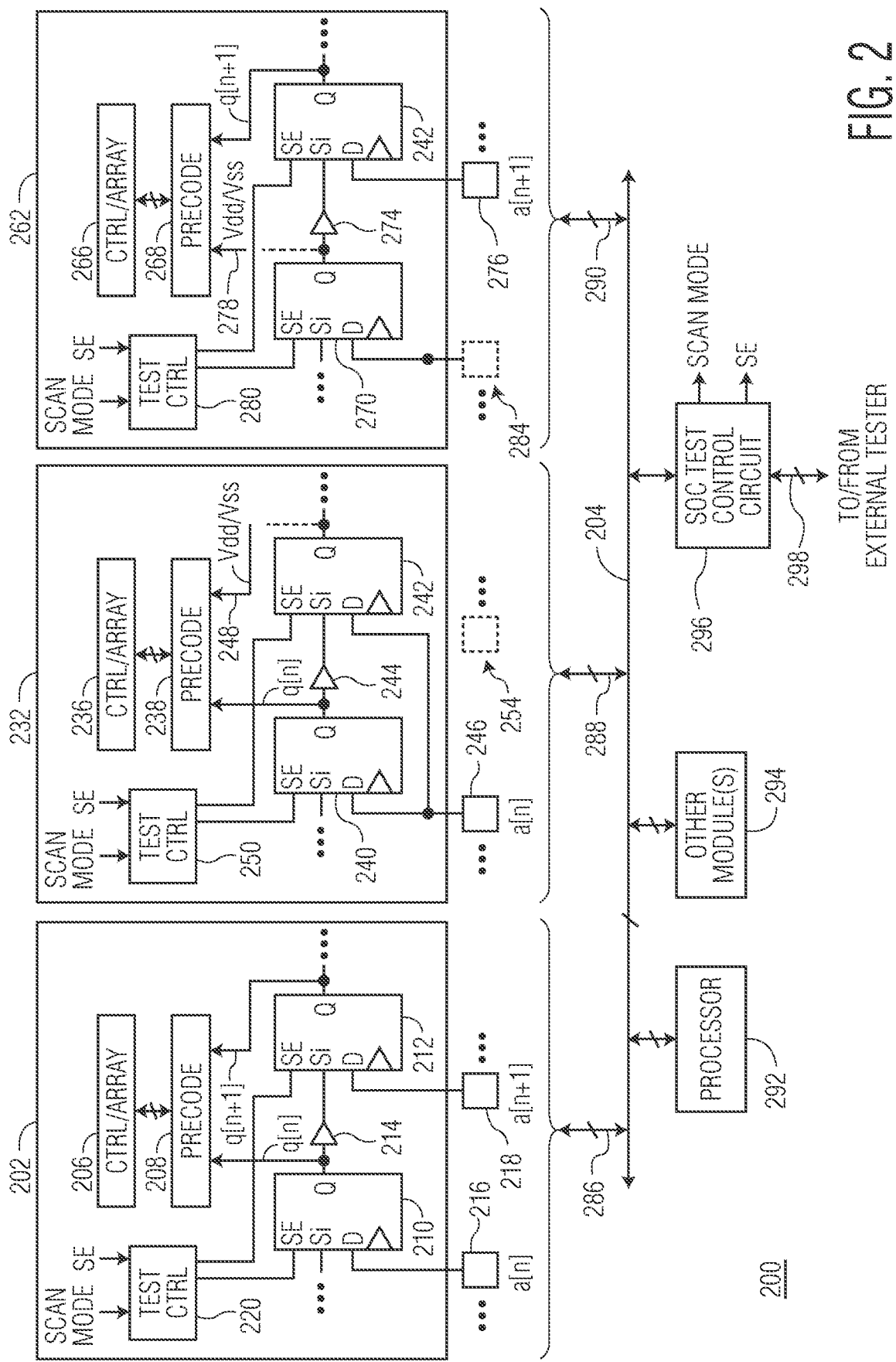
FIG. 2 illustrates a memory system in accordance with one embodiment of the present invention.

FIG. 2 illustrates an SoC 200 with a memory system including a first memory 202, a second memory 232, and a third memory 262, in accordance with one embodiment of the present invention, in which each of these memories may be different instances of a compiled memory produced by, for example, a particular memory compiler. Each instance may be sized differently and include different selected features. The memory instances on SoC 200 may be referred to collectively as a memory sub-system of SoC 200. SoC 200 (which may also be referred to as an integrated circuit), in addition to memories 202, 232, and 262, includes a system interconnect 204, a processor 292, any number of other module(s) 294, and an SoC test control circuit 296. System interconnect 204 can be any type of system interconnect, such as, for example, a system bus, a crossbar switch, a switch fabric, etc. Processor 292, other module(s) 294, SoC test control circuit 296, and each of memories 202, 232, and 262 are bidirectionally coupled to interconnect 204. Memory 202 is bidirectionally coupled to interconnect 204 via conductors 286, which is coupled to the address pins (e.g. 216 and 218) of memory 202. Memory 232 is bidirectionally coupled to interconnect 204 via conductors 288, which is coupled to address pins (e.g. address pin 246) of memory 232. Memory 262 is bidirectionally coupled to interconnect 204 via conductors 290, which is coupled to address pins (e.g. address pin 276) of memory 262.

Processor 292 can be any type of processor or processing circuitry, and other modules(s) 294 may include any type of peripherals or other processors or combinations thereof. For example, peripherals may include other memories, I/O devices, coprocessors, communication ports, etc. Alternatively, no other modules may be present. SoC test control circuit includes external connectors 298 for communicating with an external tester.

Memory 202 is a first instance of a compiled memory having a first size and configured to receive a first number, N, of address bits at its address pins. Memory 202 includes ctrl/array 206 which may include a memory array, row decoders, column decoders, and corresponding memory control circuitry and may be implemented as known in the art. Memory 202 includes a pre-decode circuit 208 and address latches 210 and 212. Address latches 210 and 212 are coupled to corresponding address pins 216 and 218, respectively, and pre-decode circuit 208 is coupled between outputs of the address latches and ctrl/array 206. Latch 210 has a D input coupled to address pin 216 to receive one bit of an N-bit address value, a[n], and latch 212 has a D input coupled to address pin 218 to receive another bit of the N-bit address value, a[n+1]. A Q output of latch 210 is coupled to pre-decode circuit 208 and to a buffer 214, and a Q output of latch 212 is coupled to pre-decode circuit 208. Note that the D input of a latch may be referred as a data input, and the Q output of a latch as the data output. Latch 210 also includes an Si input, which can be referred to as the scan input, an SE control input, and a clock input (indicated by the triangle). Similarly, latch 212 also includes an Si input, a SE control input, and a clock input. And output of buffer 214 is coupled to the Si input of latch 212.

In this embodiment, it is assumed that memory 202 includes N latches and N address pins, in which all N latches and pins are used such that each of the N latches is coupled to a uniquely corresponding pin of the N pins. That is, the N latches and the N address pins have a one-to-one correspondence. For example, memory 202 may be sized to its maximum allowable size or otherwise configured to require use of all available address latches and pins. In this example, a D input of each of the N latches is coupled to a corresponding address pin of the N address pins to receive a unique corresponding bit of the N-bit address value, a[N−1:0]. Each latch can be numbered, for example, 0 to N−1, and thus referred to as lat[0] to lat[N−1], respectively. In the illustrated embodiment, the Q output of latch 210 (i.e. lat[n]) provides q[n] to pre-decode circuit 208 and the Q output of latch 212 (i.e. lat[n+1]) provides q[n+1] to pre-decode circuit 208, in which each of n and n+1 correspond to a particular bit position of the N-bit address value. In the illustrated embodiment, n and n+1 refer to adjacent bit positions. Note that not all address bit pins or corresponding address latches are illustrated in FIG. 2, so as not to complicated the drawing.

The Q output of each address latch of the N latches is coupled to pre-decode circuit 208, and pre-decode circuit 208 provides the resulting pre-decoded address lines to ctrl/array 206. The pre-decoded address lines can be used by ctrl/array 206 to address a selected address location (i.e. storage location) with the array of memory 202, as known in the art. For example, in accessing a selected address location of memory 202, a first portion of the pre-decoded address lines may be provided to activate a selected block of the array, a second portion may be provided to a row decoder to activate a selected word line of the selected block, and a third portion may be provided to a column decoder to activate selected bit lines of the selected block.

The N address latches of memory 202, such as latches 210 and 212, can be configured as scan chains to enable scan testing. Each of the N latches would therefore be coupled analogously to example latches 210 and 212, each including an Si input to receive a test pattern from a previous latch of the scan chain (e.g. via a buffer), and each including a Q output coupled to both pre-decode circuit 208 and to an Si input of a subsequent latch (e.g. via a buffer). An Si input of a first latch of a scan chain may be connected to receive the test pattern from a test controller (rather than a previous latch), while a Q output of a last latch of the scan chain may be connected to provide the output test results to the test controller (rather than a subsequent latch). Therefore, in operation, each address latch can operate in functional mode and a scan test mode (i.e. scan mode), as was briefly described in reference to latches 110 and 112 of FIG. 1.

Memory 202 also includes a local test control circuit 220 which receives a scan mode indicator and a global scan enable (SE) indicator from SoC test control circuit 296. Although not illustrated, test control circuit 220 may also receive test patterns from SoC test control circuit 296. In one embodiment, these are all received as side band signals, outside of interconnect 204, but alternatively, they can be provided via interconnect 204. When SoC 200 is in normal operation (e.g. non-test mode), the scan mode indicator is negated to a logic level zero, and when in scan mode (e.g. scan test mode or test mode), the scan mode indicator is asserted to a logic level one. While in scan mode (while the scan mode indicator is asserted), SoC test control circuit 296 controls the assertion of the global SE to indicate shift phases of the scan mode testing (e.g. by asserting SE to a logic level one) and capture phases of the scan mode testing (e.g. by negating SE to a logic level zero).

Referring back to test control circuit 220 of memory 202, test control circuit 220 controls the assertion/negation of the SE inputs of the N address latches of memory 202 in accordance with the scan mode indicator and the global SE indicator in order to control normal operation and scan mode operation of memory 202. Also, test control 220 may include clock control circuitry which provides the appropriate functional clock or shift clock, as needed, to the clock inputs of the address latches. For example, during normal operation (when the scan mode indicator is negated), the functional clock is provided to the clock inputs of the address latches. In one embodiment, during testing (while the scan mode indicator is asserted), a shift clock is provided to the clock inputs of the address latches during the shift phase of the testing (by asserting the local SE to the address latches) and the functional clock is provided to the clock inputs during the capture phase of the testing (by negating the local SE to the address latches). The frequency of the shift clock may be different than the frequency of the functional clock. In another embodiment, the address latches may not need a clock during functional operation such that the address values are provided straight through to pre-decode circuit 208, in which case, the clocks to the address latches may be gated accordingly. Therefore, test control circuit 220 can include any logic circuits or state machines as needed to control the shift/capture phases of scan testing, as known in the art.

Each address latch, when in functional mode, operates normally to capture the input address value and provide the input address value to pre-decode circuit 208. Therefore, when test control circuit 220 negates SE, each latch provides the corresponding address value at its D input as its Q output upon receiving an active edge of the functional clock at its clock input. When in scan mode, the shift phase shifts a test pattern into each scan chain (during which a previous test result can be shifted out). During the shift phase, test control circuit 220 asserts SE such that each latch receives the value from the Q output of a previous latch of the scan chain at its Si input and latches this value on an active edge of the shift clock at its clock input. For example, the Q output of latch 210 received via buffer 214 at the Si input of latch 212 is shifted into latch 212 in response to an active edge of the shift clock. After the shifting of the test patterns into the scan chains is completed, during a subsequent capture phase of the scan mode, a predetermined number of clock cycles of the functional clock is provided. Upon entering the shift phase again, as new test patterns are shifted into the scan chains, the current values (captured in the scan chains as a result of the predetermined number of clock cycles of the functional clock applied during the capture phase) are shifted out. Note that the active edge of a clock may refer to either the falling edge or rising edge of the clock, depending on the design of the latches.

Memory 232 is a second instance of a compiled memory having a smaller size as compared to memory 202 and therefore is configured to receive Y address bits (i.e. a Y-bit address value) at its address pins, in which Y<N. Therefore, memory 232 includes only Y address pins as compared to memory 202 since only a Y-bit address value is received. Memory 232 may also include other selected features which are the same as memory 202 or different from memory 202. Memory 232 includes ctrl/array 236 (which may be implemented as known in the art), pre-decode circuit 238, address latches 240 and 242, a buffer 244, and a test control circuit 250 (which also receives the scan indicator and global SE signal from SoC test control circuit 296). Note that the operation and connectivity of these elements is analogous to the similarly named elements of memory 202. However, since memory 232 is smaller, pre-decode circuit 238 provides fewer pre-decoded address lines to ctrl/array 236 which operates on fewer address lines to address a selected memory location within the array of memory 232.

Memory 232, analogous to memory 202, still includes N address latches, in which some of the N latches are unused for latching an address value from system interconnect 204. For these unused latches, such as latch 242, the corresponding Q output is not connected to pre-decode circuit 238. Instead, the input to pre-decode circuit 238 which corresponds to the Q output of unused latch 242 is permanently tied (via connection 248) to a predetermined power supply node (e.g. which may correspond to the supply node or terminal which receives the power supply Vdd or the power supply Vss, and is thus indicated as "Vdd/Vss"), based on the desired value for pre-decode circuit 238 in light of the desired memory configuration, as will be described in reference to FIGS. 4 and 5 below. Therefore, as compared to memory 202, the Q output of latch 240 (i.e. lat[n]) provides q[n] to pre-decode circuit 238 (and may be referred to as a "used latch") but the Q output of latch 242 (i.e. lat[n+1]) does not provide q[n+1] to pre-decode circuit 238 (and may thus be referred to as an "unused latch").

The D input of unused latches, though, is connected to one of the existing Y address pins of memory 232 which is used to receive an address value from interconnect 204, such that each unused latch shares an existing address pin with a used latch. Therefore, in the illustrated embodiment, latch 240 corresponds to address pin 246, such that the D input of latch 240 is coupled to receive a[n] from interconnect 204, in which a[n] represents one bit of the Y-bit address value received by memory 232 for a memory transaction. In the illustrated embodiment, latch 242 does not correspond to an address pin (that is, in compiled memory 232, the pin corresponding to latch 242 is removed, as indicated by empty location 254, since it is not needed for receiving the Y-bit address value). The D input of latch 242 is instead also connected to address pin 246 (via connection 252) such that the D input of latch 242 receives the same value as the D input of latch 240.

As with memory 202, note that not all N address latches are illustrated in memory 232. However, each "unused latch" of the N address latches (corresponding to a total of N−Y latches) has its D input connected to an existing address pin of memory 232. Therefore, while some of the Y address pins are connected to only one of the N address latches, others of the Y address pins are connected to more than one address latch (to one of the Y latches as well as to an unused latch). In alternate embodiments, an existing pin could be instead connected to one of the Y latches and to more than one unused latches of the N latches.

With the D input of unused latch 142 of FIG. 1 permanently tied to a predetermined power supply node, during scan testing, the D input cannot be exercised (cannot be made to change states) to determine correct operation of latch 142. With unused latches, such as latch 142, therefore being untestable logic, an automatic test pattern generation (ATPG) flow will have reduced fault coverage since a scan operation cannot reach the D inputs of the used latches, and a scan capture operation will always capture the same logic state. For example, if D cannot be changed due to being permanently tied to a power supply node, unused latch 142 can never store a different state, and some faults, such as a stuck at fault at the D input or Q output of latch 142 cannot be detected. However, since the D input of unused latch 242 of FIG. 2 is exercisable by accessing shared existing pin 246, unused latch 242 can be changed and used in scan testing. Similarly, with the D inputs of any unused latch being coupled to an existing pin, they can all be included during scan testing to increase coverage.

Descriptions for memory 262 are similar to those for memory 232. Memory 262 is a third instance of a compiled memory having a smaller size as compared to memory 202 and therefore is configured to receive Z address bits (i.e. a Z-bit address value) at its address pins, in which Z<N. Therefore, memory 232 includes only Z address pins as compared to memory 202. Memory 262 can either be the same size as memory 232, or differently sized. Even if they are sized the same, there may be other configuration differences based on what other selectable features were selected for the memory compiler. For example, memory 262 may include other selected features which are the same as memory 232 or memory 202, or different from memories 232 and 202. Memory 262 includes ctrl/array 266 (which may also be implemented as known in the art), pre-decode circuit 268, address latches 270 and 272, a buffer 274, and a test control circuit 280 (which also receives the scan indicator and global SE signal from SoC test control circuit 296). Note that the operation and connectivity of these elements is analogous to the similarly named elements of memory 202. However, since memory 262 is also smaller than memory 202, pre-decode circuit 268 provides fewer pre-decoded address lines to ctrl/array 266 which operates on fewer address lines to address a selected memory location within the array of memory 262.

Memory 262, similar to memory 232 and analogous to memory 202, still includes N address latches, in which some of the N latches are unused for latching an address value from system interconnect 204. For these unused latches, such as latch 270, the corresponding Q output is not connected to pre-decode circuit 268. Instead, the input to pre-decode circuit 268 which corresponds to the Q output of unused latch 270 is permanently tied (via connection 278) to a predetermined power supply node (e.g. which may correspond to the supply node which receives the power supply Vdd or the power supply Vss, and is thus indicated as "Vdd/Vss"), based on the desired value for pre-decode circuit 268 in light of the desired memory configuration, as will be described in reference to FIGS. 4 and 5 below. Therefore, as compared to memories 202 and 232, the Q output of latch 272 (i.e. lat[n+1]) provides q[n+1] to pre-decode circuit 268 but the Q output of latch 282 (i.e. lat[n]) does not provide q[n] to pre-decode circuit 268.

In the example of memory 262, regardless of whether the size of memory 262 is the same or different as memory 232, those latches of the N latches which are unused in memory 262 may differ from those latches of the N latches which are unused in memory 232, due to their configurations. With memory 262, latch 270 (rather than latch 272) is an unused latch which corresponds to a removed pin, indicated by empty location 284. In this example, the D input of unused latch 270 is connected to pin 276 (via connection 282), corresponding to an existing pin of the Z address pins for memory 262. Therefore, the D input of unused latch 270, as with the D input of unused latch 242, are exercisable during scan testing. In one embodiment, as another advantage of using different instances of a compiled memory, the scan chains of the various instances (e.g. memories 202, 232, and 262) are similarly configured. Therefore, in this embodiment, the scan chains of the memory subsystem of SoC 200 can span multiple memories. For example, a portion of a scan chain may be located in memory 202, while another portion of the same scan chain may be located in memory 232.

In performing scan testing on all or portions of SoC 200, the test patterns may be generated by an ATPG flow executed in SoC 200 or in an external tester and provided to SoC test control circuit 296 via connectors 298. SoC test control circuit 296 can then provide these test patterns to each of the scan chain inputs, as needed, in which a scan chain input corresponds to the Si input of a first latch of a scan chain. The scan test results which are shifted out during the shift phase can be provided to and stored in SoC test control circuit 296, and can also be communicated back to the external tester via conductors 298. The received test results can be compared to expected results to determine whether the scan tests are passed or failed. This analysis of the test results can be performed by either SoC test control circuit 296 or by the external tester. The circuitry in SoC 200 which controls and performs the scan testing may be referred to generally as built-in self-test (GIST) circuitry.

Figure 3:
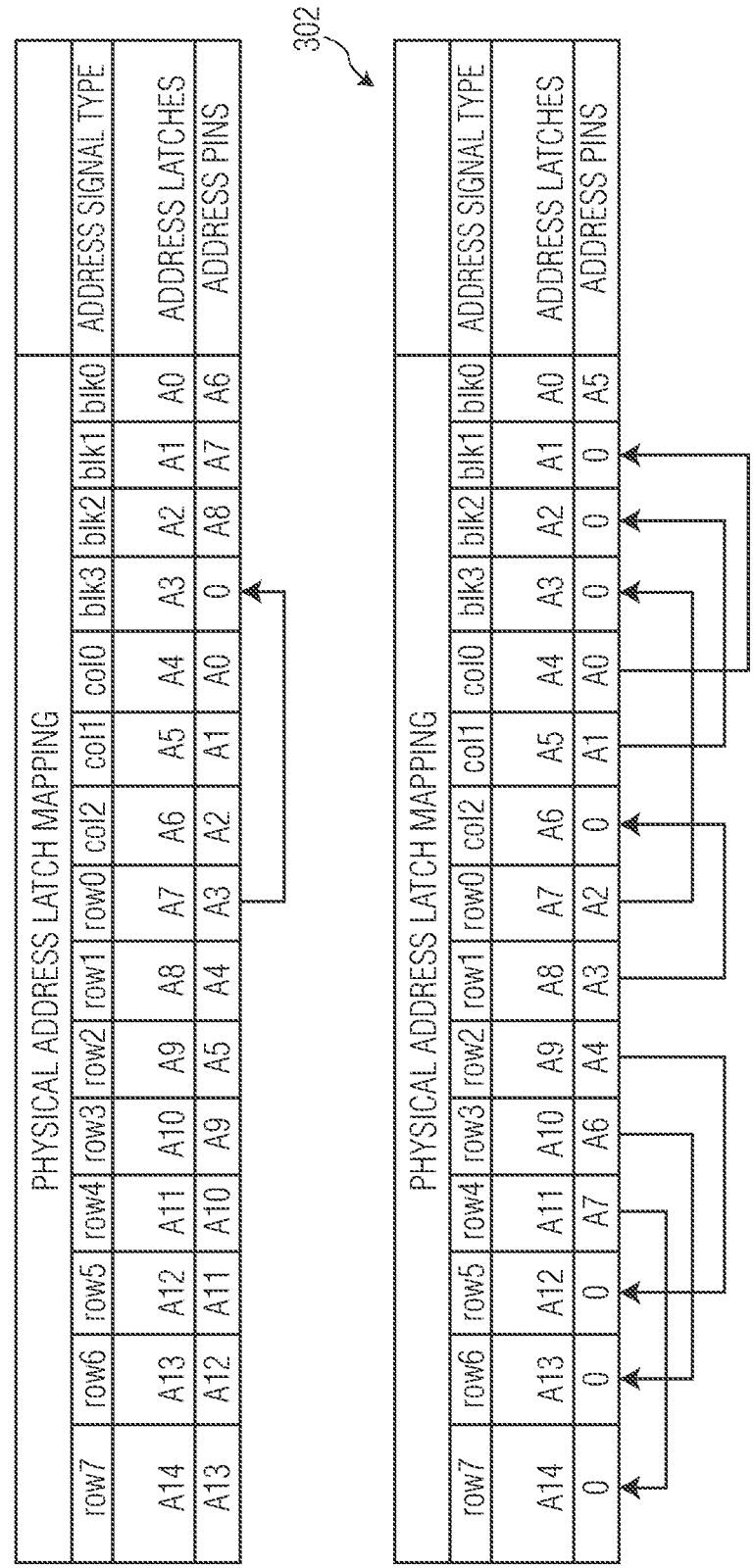
FIG. 3 illustrates example address configurations of two memory instances of a memory system, in accordance with an embodiment of the present invention.

FIG. 3 illustrates, in table form, address configurations for two instances of a compiled memory, in accordance with one embodiment of the present invention. Tables 300 and 302 correspond to first and second instances, respectively, of a compiled memory, in which the first instance is a larger memory that then second instance. In one embodiment, both instances are compiled by a same memory compiler having a selectable size. (Note that tables 300 and 302 may also be referred to as memory 300 and memory 302, respectively.) For memories 300 and 302, there are 15 possible address latches (A0-A14) in which an instance of the compiled memory having the largest selectable size may require all 15 address pins (requiring all of the 15 available address latches). Alternatively, other selected features, in addition to size, may result in requiring 15 address pins and all available address latches. In each of the tables of FIG. 3, note that the middle line labeled "address latches" delineates the 15 available address latches, labeled as latches [A14:A0].

Note that while the descriptions herein have been made with respect to address latches which are configured to store corresponding bits of an address value, the embodiments herein can be applied to latches of control pins (such as, e.g., test mode control pins) or other types of pins for a memory which may or may not be available as selectable features (i.e. as compiler options) for a memory compiler. Also, note that local test control circuits (e.g. 220, 250, 280) and SoC test control circuit 296 may be referred to collectively as test control circuitry, and, in alternate embodiments, may be distributed differently among the memories of the memory subsystem and differently between the memories and SoC test control circuit 296.

In the illustrated embodiment of FIG. 3, the 15 address latches/pins are designed (as dictated by the particular memory compiler used to generate compiled memories 300 and 302) such that address bits a[14:0] include row address bits (for addressing a row of the compiled memory), column address bits (for addressing a column of the compiled memory), and block address bits (for addressing a block of the compiled memory. In the examples of FIG. 3, the memory compiler utilizes 4 address bits from latches [A3:A0] as providing up to 4 bits of block address bits [blk3:blk0], 3 address bits from latches [A6:A4] as providing up to 3 bits of column address bits [col2:col0], and 8 address bits from latches [A14:A7] as providing up to 8 bits of row address bits [row7:row0], as labeled across in the first row of each table. Based on the selected size of each memory instance, 1-4 block address bits, 1-3 column address bits, and 1-8 column bits are used from address bits a[14:0] and thus would be provided from the pre-decode circuit to the ctrl/array of the corresponding memory. In a compiled memory, address pins are only provided for the needed address bits. However, even if the address pin corresponding to an unused address bit is not included in the memory, the corresponding address latches for the unused address bits are still present in the memory.

Referring to memory 300, all address bits are used for addressing a location within memory 300 except for one block address bit, blk3. Therefore, while memory 300 includes 15 latches, memory 300 uses only 14 address pins to receive a 14-bit address value, in which latch A3 is an unused latch. The 14 existing address pins [A13:A0] can be assigned in any manner by the memory compiler to corresponding address latches. Therefore, as indicated in the third row of the corresponding table for memory 300, address pins [A2:A0] correspond to latches [A6:A4], respectively, such that the D inputs of these latches receive col2:col0, address pins [A13:A3] correspond to latches [A14:A7], respectively, such that the D inputs of these latches receive row7:row0, and address pins [A8:A6] correspond to latches [A2:A0], respectively, such that the D inputs of these latches receive blk3:blk0. Note that latch A3 is not used so there is no existing address pin corresponding directly to A3, as indicated by the 0 in the third row of the table. In this case, the D input for unused address latch A3 is connected to existing address pin A3, as indicated by the arrow linking address pin A3 to latch A3. The D input of unused address latch A3 thus shares the same input with the D input of address latch A7.

Referring to memory 302, which is a smaller memory than memory 300, only one block address bit [blk0], 2 column address bits [col1:col0], and 5 row address bits [row4:row0] are used for a total of 8 bits. Memory 302 therefore only includes 8 memory pins for receiving an 8-bit address value, leaving 7 unused address latches (latches [A3:A1, A6, A14:A12]) of the 15 total address latches. As indicated in the third row of the corresponding table for memory 302, address pins [A1:A0] correspond to latches [A5:A4], respectively, such that the D inputs of these latches receive col1:col0, address pin [A5] corresponds to latch [A0] such that the D input of this latch receives blk0, and address pins [A7:A2] correspond to latches [A11:A7], respectively, such that the D inputs of these latches receive row3:row0. Note that for any unused latch, there is no existing address pin corresponding directly the latch, as indicated by the Os in the third row of the table. However, as indicated by the arrows under the third row, an existing address pin is linked to each unused latch. In these cases, the D input for unused address latch is connected to an existing address pin such that the D input of the unused address latch shares the same input with the D input of the address latch corresponding to the linked existing address pin.

In the illustrated example, the D input for unused address latch A1 is connected to existing address pin A0, the D input for unused address latch A2 to existing address pin A1, the D input for unused address latch A3 to existing address pin A2, the D input for unused address latch A6 to existing address pin A3, the D input for unused address latch A12 to existing address pin A4, the D input for unused address latch A13 to existing address pin A6, and the D input for unused address latch A14 to existing address pin A7. Note that in this example, the address pins are not necessarily sequentially assigned to corresponding latches. For example, while address pins A7:A6 and A4:A2 provide the 5 row address bits to latches A11:A7, respectively, pin A5 instead provides one block bit, blk0, to latch A0. Also note that not every existing address pin needs to share with an unused latch, as can be seen with existing address pin A5 which is not linked (and thus not connected) to any of the unused latches. In the example of memory 302, it can be seen that any existing pin that is connected to a D input of an unused latch (e.g. pin A0 connected to unused latch A1) is also connected to a D input of a used latch (e.g. pin A0 is also connected to its corresponding used latch A4). That is, memory 302 does not include any pins which are coupled to a D input of an unused latch without also being coupled to at least one D input of a used latch. Therefore the memory compiler can generate many different instances of a compiled memory, and by connecting the D inputs of any unused latches to an existing pin, the unused latches can still be used as part of the scan chains and improve fault coverage as compared to connecting the D inputs of these unused latches to a permanently fixed input value.

Figure 5:
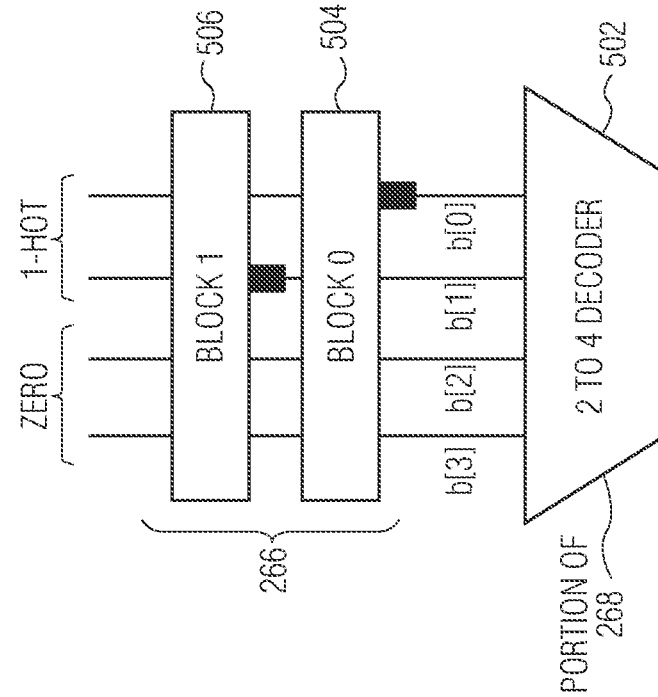
FIGS. 4 and 5 illustrate example pre-decoders for use within the memory system of FIG. 2, in accordance with one embodiment of the present invention.
Figure 4:
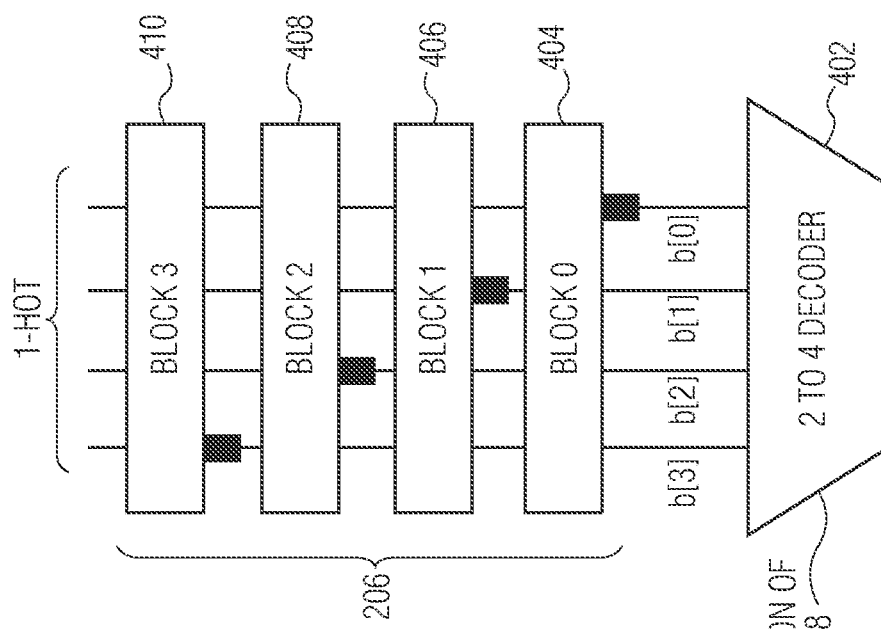

FIGS. 4 and 5 include examples of the logic which may be used in a pre-decode circuit of a compiled memory (memory_0 and memory_1, respectively) in accordance with embodiments of the present invention. FIGS. 4 and 5 provide an example with respect to how two address latch outputs are pre-decoded to provide pre-decoded address lines (also referred to as pre-decoded address bits) to the ctrl/array of the memory. In one example, as in the examples of FIG. 3, up to 4 bits may be used to select a memory block within a memory array to access for a memory transaction. In the embodiment of FIG. 4, it is assumed that 2 bits are received as the block decode bits (e.g. blk1:blk0) and are provided to the pre-decode circuit at the outputs of two of the address latches as q[n] and q[n+1]. For example, these outputs may correspond to the outputs of latches 210 and 212 of FIG. 2. In one embodiment, these two bits are decoded to provide a 1-hot 4-bit output (b[3:0]) to select one of 4 memory blocks, in which assertion of b[0] selects a first block, assertion of b[1] selects a second block, assertion of b[2] selects a third block, and assertion of blk[3] selects a fourth block. A 1-hot output indicates that only one of the 4 output bits is asserted.

Referring to FIG. 4, blocks 0-4 of memory_0 are memory blocks of the memory array (e.g. ctrl/array 206) of the compiled memory (e.g. 202). The pre-decode circuit (e.g. pre-decode circuit 208) includes a 2-to-4 decode circuit 402, which decodes 2 received bits to output a resulting 1-hot 4 bits, and can be implemented such that if q[n] and q[n+1]=% 00 (in which a "%" preceding a value indicates a binary value), b[3:0]=% 0001, if q[n] and q[n+1]=% 01, b[3:0]=% 0010, if q[n] and q[n+1]=%10, b[3:0]=% 0100, and if q[n] and q[n+1]=% 11, b[3:0]=% 1000. In FIG. 1, b[3:0] may be provided to each of blocks 0-3, and a dark block on a line corresponds to the line that is asserted (made "hot") to select the corresponding block. For example, when b[0] is asserted, block 0 404 is selected, when b[1] is asserted, block 1 406 is selected, when b[2] is asserted, block 2 408 is selected, and when b[3] is asserted, block 3 410 is asserted. The row and column address bits can then be decoded to address a particular address location within the selected block. Note that any known circuitry may be used to implement the logic of the 2-to-4 decoder. Additional decoder circuitry would be included in the pre-decode circuitry to process the row and column bits as well.

Referring to FIG. 5, only block 0 504 and block 1 506 of memory_1 are selectable memory blocks of the memory array (e.g. ctrl/array 266) of the compiled memory (e.g. 262). In this case, only one bit is received as the block address bit (blk0) to select between the blocks, and is provided at the output of address latch q[n+1]. In this example, this output may correspond to the output of latch 272 of FIG. 2, in which latch 270 is an unused latch. The Q output of the unused latch is not provided to the pre-decode circuit, therefore, the input to the pre-decode circuit which corresponds to this latch, if it were being used, is tied to a circuit node, tie_net. As illustrated in FIG. 2, this input to the pre-decode circuit may correspond to the input which is now tied (via connection 278) to either the Vdd or Vss voltage supply node (as the tie_net node). In the example of FIG. 5, the pre-decode circuit (e.g. pre-decode circuit 268) includes a 2-to-4 decoder circuit 502 which also receives 2 input bits and provides a resulting 1-hot 4-bit output. In this case, tie_net is set to either Vdd or Vss as needed for 2-to-4 decoder 502 to result in only one of b[1] and b[0] being asserted while b[3] and b[2] remain negated (i.e. remain zero). In this case, regardless of the value of q[n+1], only one of blocks 0 or 1 is selected as b[3] and b[2] can never be asserted due to the value of tie_net. In one embodiment, decoder 502 is implemented with tie_net set to Vdd or Vss such that if q[n+1]=% 0 then b[3:0]=% 0001 and if q[n+1]=% 1, b[3:0]=% 00010. Note that any known circuitry may be used to implement the logic of the 2-to-4 decoder. Additional decoder circuitry would be included in the pre-decode circuitry to process the row and column bits as well.

Therefore, by now it can be understood how unused latches of a compiled memory, such as unused address latches, corresponding to removed pins can be connected in order to achieve improved scan test coverage. In one aspect, while the outputs of the unused latches are not used by a pre-decoder to generate the appropriate address bits for addressing a location within the array of the compiled memory, the data inputs of the unused latches are connected to existing pins. That is, the latch corresponding to an existing pin may share the existing pin with an unused latch. In this manner, the unused latch does not become untestable logic since its input can change state and thus capture different values during a capture phase of a scan test. Improved coverage can therefore be achieved since the unused latches are also testable rather than fixed to a permanent state.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value or circuit elements for corresponding bit locations. For example, "bus 60 [7:0]" or "conductors [7:0] of bus 60" indicate the eight lower order conductors of bus 60, "address bits [7:0]" or "ADDRESS [7:0]" indicate the eight lower order bits of an address value, "latches [7:0]" indicates the latches corresponding to the eight lower bit locations of a value being latched by the latches, and "pins [7:0]" indicates the pins corresponding to the eight lower bit locations of a received value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of system 200 are circuitry located on a single integrated circuit or within a same device. Alternatively, system 200 may include any number of separate integrated circuits or separate devices interconnected with each other. For example, one or more of other module(s) 294 may be located on a same integrated circuit as processor 292 or the memory subsystem.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the compiled memories of the memory subsystem may be any type of memory configured in different ways, but which include scan circuitry which can be implemented as described above. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a system includes test control circuitry; and a first memory including a memory array; a pre-decode circuit; and a plurality of address latches, each configured to operate in a scan chain of a plurality of scan chains for scan testing, wherein a first set of the plurality of address latches each has a data input coupled to a corresponding address pin of the first memory and each has an output coupled to the pre-decode circuit, and a second set of the plurality of address latches, mutually exclusive of the first set, each has a data input coupled to a data input of at least one latch in the first set of the plurality of latches and each is configured to not provide any input to the pre-decode circuit. In one aspect, the output of each latch of the plurality of address latches is coupled to a scan input of a subsequent latch of the plurality of address latches in a corresponding scan chain. In a further aspect, a total number of address pins of the first memory is less than a total number of address latches of the plurality of address latches. In yet a further aspect, the total number of address pins of the first memory is equal to a total number of address latches in the first set of the plurality of address latches. In another further aspect, the output of each latch of the plurality of address latches is coupled to the scan input of the subsequent latch of the plurality of address latches in the corresponding scan chain via a corresponding buffer. In another aspect of the embodiment, the pre-decode circuit is configured to provide a plurality of pre-decoded address lines to the memory array, wherein the pre-decoded address lines address a selected storage location within the memory array. In a further aspect, the pre-decode circuit is coupled to receive a plurality of inputs, each input of a first set of the plurality of inputs corresponding to a latch of the first set of the plurality of address latches and each input of a second set of the plurality of inputs corresponding to a latch of the second set of the plurality of address latches, wherein each input of the first set of the plurality of inputs is coupled to an output from a corresponding latch of the first set of the plurality of address latches, and each input of the second set of the plurality of inputs, mutually exclusive of the first set of the plurality of inputs, is coupled to receive a fixed predetermined voltage. In a further aspect, each input of the second set of the plurality of inputs is coupled to a voltage supply terminal. In another aspect, the test control circuitry is configured to provide test patterns to the plurality of scan chains during a shift phase of the scan testing, enable a capture phase of the scan testing, and receive test results from the plurality of scan chains during the shift phase of the scan testing.

In another embodiment, a system includes test control circuitry configured to perform scan testing of a plurality of scan chains; a first compiled memory of a first size generated by a memory compiler, and a second compiled memory, smaller than the first size, generated by the memory compiler. The first compiled memory includes a first memory array; a first pre-decode circuit; and a first plurality of latches, each configured to operate as part of the plurality of scan chains, wherein each latch of the first plurality of latches has a data input coupled to a corresponding pin of the first memory and an output coupled to the first pre-decode circuit. The second compiled memory includes a second memory array; a second pre-decode circuit; and a second plurality of address latches, each configured to operate as part of the plurality of scan chains, wherein a first set of the second plurality of latches each has a data input coupled to a corresponding pin of the second compiled memory and each has an output coupled to the second pre-decode circuit, and a second set of the second plurality of latches, mutually exclusive of the first set of the second plurality of latches, each has a data input coupled to a data input of at least one latch in the first set of the second plurality of latches and each is configured to provide no input to the second pre-decode circuit. In one aspect, the output of each latch of the first and second plurality of latches is coupled to a scan input of a subsequent latch in a corresponding scan chain. In a further aspect, at least one scan chain of the plurality of scan chains spans both the first and second compiled memories. In one aspect of the another embodiment, the second compiled memory does not include any pins which are coupled to data inputs of the second set of the second plurality of latches without also being coupled to at least one data input of the first set of the second plurality of latches. In a further aspect, a total number of latches of the first plurality of latches equals a total number of latches of the second plurality of latches, but a total number of pins of the second compiled memory is less than a total number of pins of the first compiled memory. In a further aspect, each latch of the first and second plurality of latches is characterized as an address latch and each corresponding pin of the first compiled memory and the second compiled memory is characterized as an address pin. In yet a further aspect, the first pre-decode circuit is configured to provide outputs of the first plurality of latches as a first plurality of pre-decoded address lines to the first memory array, wherein the first plurality of pre-decoded address lines address a selected storage location within the first memory array, and the second pre-decode circuit is configured to provide a second plurality of pre-decoded address lines to the memory array, wherein the second plurality of pre-decoded address lines address a selected storage location within the second memory array, wherein a total number of bits of the first plurality of pre-decoded address lines which address the selected storage location within the first memory array is greater than a total number of bits of the second plurality of pre-decoded address lines which address the selected storage location with in the second memory array. In yet a further aspect, the first pre-decode circuit is coupled to receive a first plurality of inputs, each coupled to an output of a corresponding latch of the first plurality of latches, and the second pre-decode circuit is coupled to receive a second plurality of inputs, each input of a first set of the second plurality of inputs corresponding to a latch of the first set of the second plurality of latches and each input of a second set of the second plurality of inputs corresponding to a latch of the second set of the second plurality of inputs, wherein each input of the first set of the second plurality of inputs is coupled to an output from a corresponding latch of the first set of the second plurality of address latches, and each input of the second set of the second plurality of inputs is coupled to receive a voltage supply terminal. In another aspect, the data input of each latch of the second set of the second plurality of latches is coupled to a shared pin of the second compiled memory which is also coupled to a data input of a latch in the first set of the second plurality of address latches. In yet another aspect of the another embodiment, the system further includes a system interconnect, wherein the corresponding pins of the first compiled memory and the corresponding pins of the second compiled memory are coupled to the system interconnect; and a processor coupled to the system interconnect.

In yet another embodiment, a system includes a plurality of compiled memories, each compiled memory including N corresponding latches coupled between a corresponding set of X pins and a corresponding pre-decode circuit, the pre-decoder configured to provide pre-decoded address bits which address a selected storage location in a corresponding memory array, wherein each of N and X is an integer greater than or equal to one. In each compiled memory, the set of N corresponding latches includes a set of X used latches and a set of Y unused latches such that N=X+Y, Y being an integer greater than or equal to zero. Each of the X used latches has an input coupled to a corresponding pin of the corresponding set of X pins with a one-to-one correspondence between the X latches and the X pins, and an output configured to provide an input to the corresponding pre-decoder. Each of the Y unused latches is configured to not provide any input to the corresponding pre-decoder, and has an input coupled to an input of a used latch within the set of X used latches of the compiled memory and to the corresponding pin of the used latch.

What is claimed is:

1. A system, comprising:
test control circuitry; and
a first memory comprising:
 a memory array;
 a pre-decode circuit; and
 a plurality of address latches, each configured to operate in a scan chain of a plurality of scan chains for scan testing, wherein:
  a first set of the plurality of address latches each has a data input coupled to a corresponding address pin of the first memory, each has a scan input, and each has an output coupled to the pre-decode circuit, and
  a second set of the plurality of address latches each has a data input coupled to a data input of at least one latch in the first set of the plurality of latches, each has a scan input, and each is configured to not provide any input to the pre-decode circuit, wherein no address latch of the first set is in the second set and no address latch of the second set is in the first set.

2. The system of claim 1, wherein the output of each latch of the plurality of address latches is coupled to a scan input of a subsequent latch of the plurality of address latches in a corresponding scan chain.

3. The system of claim 2, wherein a total number of address pins of the first memory is less than a total number of address latches of the plurality of address latches.

4. The system of claim 3, wherein the total number of address pins of the first memory is equal to a total number of address latches in the first set of the plurality of address latches.

5. The system of claim 2, wherein the output of each latch of the plurality of address latches is coupled to the scan input of the subsequent latch of the plurality of address latches in the corresponding scan chain via a corresponding buffer.

6. The system of claim 1, wherein the pre-decode circuit is configured to provide a plurality of pre-decoded address lines to the memory array, wherein the pre-decoded address lines address a selected storage location within the memory array.

7. The system of claim 6, wherein the pre-decode circuit is coupled to receive a plurality of inputs, each input of a first set of the plurality of inputs corresponding to a latch of the first set of the plurality of address latches and each input of a second set of the plurality of inputs corresponding to a latch of the second set of the plurality of address latches, wherein each input of the first set of the plurality of inputs is coupled to an output from a corresponding latch of the first set of the plurality of address latches, and each input of the second set of the plurality of inputs, mutually exclusive of the first set of the plurality of inputs, is coupled to receive a fixed predetermined voltage.

8. The system of claim 7, wherein each input of the second set of the plurality of inputs is coupled to a voltage supply terminal.

9. The system of claim 1, wherein the test control circuitry is configured to provide test patterns to the plurality of scan chains during a shift phase of the scan testing, enable a capture phase of the scan testing, and receive test results from the plurality of scan chains during the shift phase of the scan testing.

10. A system, comprising:
test control circuitry configured to perform scan testing of a plurality of scan chains;
a first compiled memory of a first size generated by a memory compiler, the first compiled memory comprising:
 a first memory array;
 a first pre-decode circuit; and
 a first plurality of latches, each configured to operate as part of the plurality of scan chains, wherein each latch of the first plurality of latches has, in addition to a scan input, a data input coupled to a corresponding pin of the first memory and an output coupled to the first pre-decode circuit; and
a second compiled memory of a second size, smaller than the first size, generated by the memory compiler, the second compiled memory comprising:
 a second memory array;
 a second pre-decode circuit; and
 a second plurality of address latches, each configured to operate as part of the plurality of scan chains, wherein:
  a first set of the second plurality of latches each has a data input coupled to a corresponding pin of the second compiled memory, each has a scan input, and each has an output coupled to the second pre-decode circuit, and
  a second set of the second plurality of latches each has a data input coupled to a data input of at least one latch in the first set of the second plurality of latches, each has a scan input, and each is configured to provide no input to the second pre-decode circuit, wherein no latch of the first set is in the second set and no latch of the second set is in the first set.

11. The memory system of claim 10, wherein the output of each latch of the first and second plurality of latches is coupled to a scan input of a subsequent latch in a corresponding scan chain.

12. The memory system of claim 11, wherein at least one scan chain of the plurality of scan chains spans both the first and second compiled memories.

13. The memory system of claim 10, wherein the second compiled memory does not include any pins which are coupled to data inputs of the second set of the second plurality of latches without also being coupled to at least one data input of the first set of the second plurality of latches.

14. The memory system of claim 13, wherein a total number of latches of the first plurality of latches equals a total number of latches of the second plurality of latches, but a total number of pins of the second compiled memory is less than a total number of pins of the first compiled memory.

15. The memory system of claim 14, wherein each latch of the first and second plurality of latches is characterized as an address latch and each corresponding pin of the first compiled memory and the second compiled memory is characterized as an address pin.

16. The system of claim 15, wherein:
the first pre-decode circuit is configured to provide outputs of the first plurality of latches as a first plurality of pre-decoded address lines to the first memory array, wherein the first plurality of pre-decoded address lines address a selected storage location within the first memory array, and
the second pre-decode circuit is configured to provide a second plurality of pre-decoded address lines to the memory array, wherein the second plurality of pre-decoded address lines address a selected storage location within the second memory array, wherein a total number of bits of the first plurality of pre-decoded address lines which address the selected storage location within the first memory array is greater than a total number of bits of the second plurality of pre-decoded address lines which address the selected storage location with in the second memory array.

17. The system of claim 16, wherein:
the first pre-decode circuit is coupled to receive a first plurality of inputs, each coupled to an output of a corresponding latch of the first plurality of latches, and
the second pre-decode circuit is coupled to receive a second plurality of inputs, each input of a first set of the second plurality of inputs corresponding to a latch of the first set of the second plurality of latches and each input of a second set of the second plurality of inputs corresponding to a latch of the second set of the second plurality of inputs, wherein each input of the first set of the second plurality of inputs is coupled to an output from a corresponding latch of the first set of the second plurality of address latches, and each input of the second set of the second plurality of inputs is coupled to receive a voltage supply terminal.

18. The system of claim 15, wherein the data input of each latch of the second set of the second plurality of latches is coupled to a shared pin of the second compiled memory which is also coupled to a data input of a latch in the first set of the second plurality of address latches.

19. The system of claim 10, further comprising:
a system interconnect, wherein the corresponding pins of the first compiled memory and the corresponding pins of the second compiled memory are coupled to the system interconnect; and
a processor coupled to the system interconnect.

20. A system, comprising:
a plurality of compiled memories, each compiled memory including N corresponding latches coupled between a corresponding set of X address pins and a corresponding pre-decoder, the corresponding pre-decoder configured to provide pre-decoded address bits which address a selected storage location in a corresponding memory array, wherein each of N and X is an integer greater than or equal to one, and wherein:
in each compiled memory, the set of N corresponding latches includes a set of X used latches and a set of Y unused latches such that N=X+Y, Y being an integer greater than or equal to one, wherein:
each of the one or more X used latches has a data input coupled to a corresponding address pin of the corresponding set of X address pins with a one-to-one correspondence between the X latches and the X address pins, a scan input, and an output configured to provide an input to the corresponding pre-decoder, and
each of the one or more Y unused latches is configured to not provide any input to the corresponding pre-decoder, and has a data input coupled to a data input of a used latch within the set of X used latches of the compiled memory and to the corresponding address pin of the used latch, and has a scan input.

* * * * *